(12) United States Patent
Andideh

(10) Patent No.: US 7,196,422 B2
(45) Date of Patent: Mar. 27, 2007

(54) LOW-DIELECTRIC CONSTANT STRUCTURE WITH A MULTILAYER STACK OF THIN FILMS WITH PORES

(75) Inventor: Ebrahim Andideh, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/022,456

(22) Filed: Dec. 14, 2001

(65) Prior Publication Data
US 2003/0111712 A1 Jun. 19, 2003

(51) Int. Cl.
*H01L 23/48* (2006.01)

(52) U.S. Cl. .......................... 257/760; 257/637; 257/758

(58) Field of Classification Search ............... 257/635, 257/637, 641, 642, 644, 758–760, 762, 650; 438/623, 622, 624, 725
See application file for complete search history.

(56) References Cited

U.S. PATENT DOCUMENTS

| 5,488,015 A | * | 1/1996 | Havemann et al. ......... 438/624 |
| 5,561,318 A | * | 10/1996 | Gnade et al. ............... 257/638 |
| 5,569,058 A | * | 10/1996 | Gnade et al. ................ 445/24 |

* cited by examiner

*Primary Examiner*—Hung Vu
(74) *Attorney, Agent, or Firm*—George Chen

(57) ABSTRACT

The present invention describes a structure having a multi-layer stack of thin films, the thin films being a low-dielectric constant material, the thin films having pores, and a method of forming such a structure.

12 Claims, 2 Drawing Sheets

LOW-DIELECTRIC CONSTANT STRUCTURE WITH A MULTILAYER STACK OF THIN FILMS WITH PORES

BACKGROUND OF THE INVENTION

1. Field of the Invention

The present invention relates to the field of semiconductor integrated circuit (IC) manufacturing, and more specifically, to a structure with a low dielectric constant and a method of forming such a structure.

2. Discussion of Related Art

As design rules for integrated circuits (ICs) continue to shrink, more layers of metallization become necessary in the back end processing to connect the additional transistors fabricated in the semiconductor substrate during the front end processing. Dielectric films are needed to provide insulation between metal lines on the same level and between metal lines on different levels.

The dielectric films play an integral part in determining the performance and the reliability of a multilevel metal system. Reducing intermetal dielectric capacitance will decrease interconnect Resistance-Capacitance (RC) delay, thus allowing higher speeds to be achieved by the devices. Reducing capacitance will also decrease cross talk interference between metal lines and minimize Alternating Current (AC) power dissipation.

Many challenges are provided by the device topography and the thermal budget. The device topography may require the filling of dielectric films into gaps with high aspect ratios. The thermal budget of the diffusions and the metallurgy may limit the processing temperatures and times of the dielectric films.

Successful integration of dielectric films into a multilevel metal system requires careful consideration of the mechanical, chemical, and electrical properties of the dielectric films. The properties of dielectric films are strongly dependent on the deposition process. Silicon Dioxide is commonly chosen for the dielectric film because of its many desirable properties and the variety of deposition processes available. However, the dielectric constant of Silicon Dioxide is about 4.0 which is not low enough for advanced ICs that must operate at high frequencies.

Thus, what is needed is a structure with a low dielectric constant and a method of forming such a structure.

DETAILED DESCRIPTION OF THE PRESENT INVENTION

In the following description, numerous particular details, such as specific materials, dimensions, and processes, are set forth in order to provide a thorough understanding of the present invention. However, one skilled in the art will realize that the invention may be practiced without these particular details. In other instances, well-known semiconductor equipment and processes have not been described in particular detail so as to avoid obscuring the present invention.

The present invention describes a low-dielectric constant structure with a multilayer stack of thin films with pores and a method of forming such a structure. Small pores are embedded within each thin film in the multilayer stack to reduce the effective dielectric constant of the multilayer stack. Parasitic capacitance is directly proportional to the dielectric constant so reducing the dielectric constant will reduce Resistance-Capacitance (RC) delay. Lowering the total capacitance also decreases Alternating Current (AC) power dissipation and decreases cross talk interference between adjacent metal lines.

Figure 1:
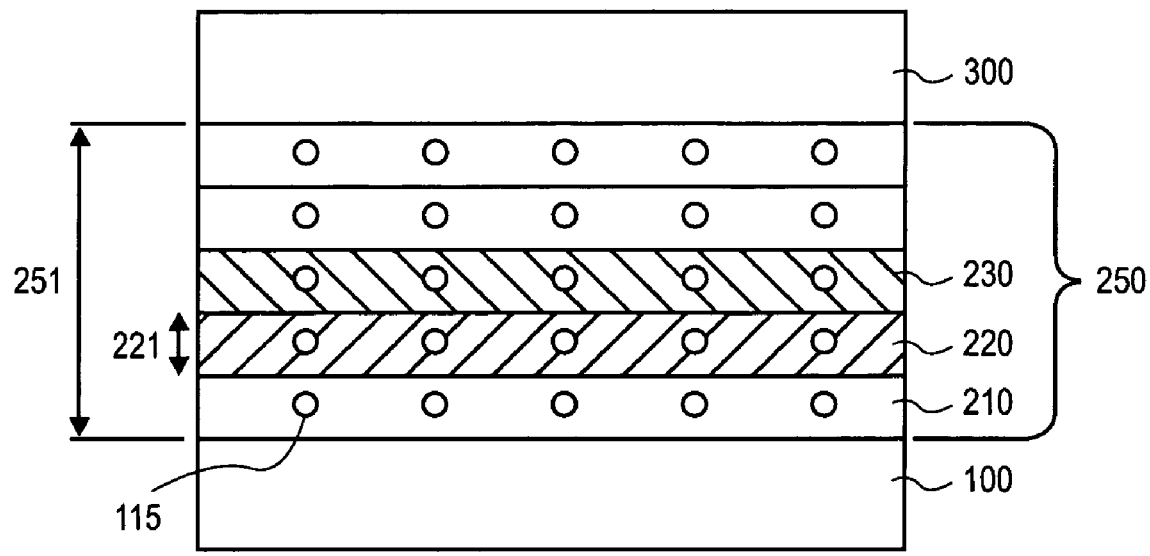
FIG. 1 is an illustration of an elevation view of an embodiment of a low-dielectric constant structure with a multilayer stack of thin films with pores according to the present invention.

An embodiment of a multilayer stack 250 of thin films with pores 115 is shown in FIG. 1. The multilayer stack 250 is part of a multilevel interconnect system. The multilayer stack 250 isolates metal lines from the same level as well as metal lines from different levels. For example, the multilayer stack 250 is located between an underlying metal level 100 and an overlying metal level 300. The metal levels may include Aluminum or Copper. As needed, barrier layers may separate the multilayer stack 250 from both the underlying metal level 100 and the overlying metal level 300. The underlying metal level 100 and the overlying metal level 300 may be connected elsewhere with a metal plug. The metal plug may include Tungsten or Copper.

A low-dielectric constant structure with a multilayer stack of thin films with pores will be described first. The multilayer stack 250 of thin films includes a thin film 220 with a low dielectric constant. In one embodiment, the thin film 220 includes an inorganic oxide, such as Silicon Dioxide or silica with a dielectric constant of about 4.0. The thin film 220 has a thin film thickness 221 that is less than about 20.0% of the critical dimension (CD) of the features in the devices. For example, if the devices have features with a CD of about 70.0 nanometers (nm), the thin film thickness 221 should be less than about 14.0 nm.

Figure 2:
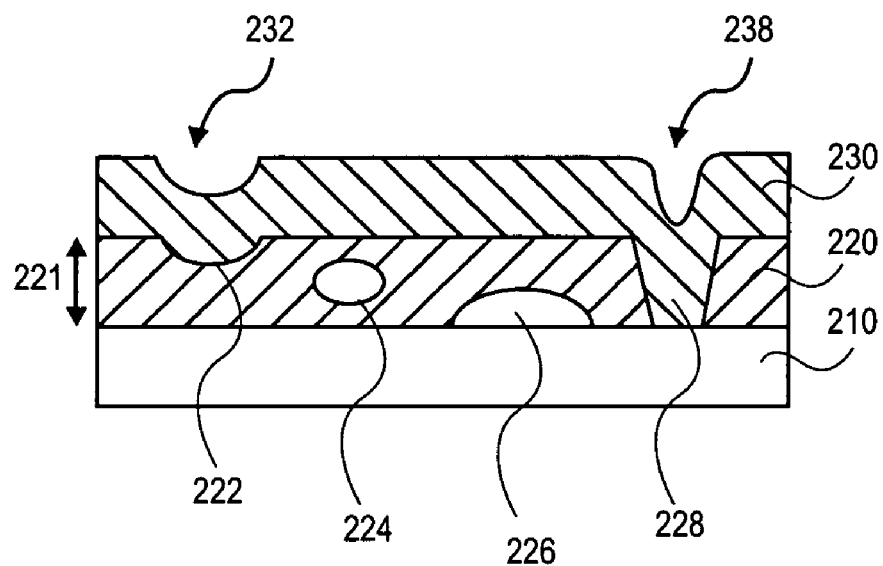
FIG. 2 is an illustration of an elevation view of an embodiment of a thin film with pores according to the present invention.
Figure 3A:
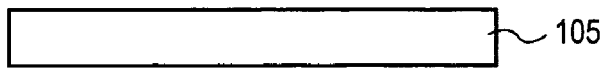
FIGS. 3(*a*)–(*f*) is an illustration of an embodiment of a method of forming a low-dielectric constant structure with a multilayer stack of thin films with pores according to the present invention.
Figure 3B:
Figure 3C:
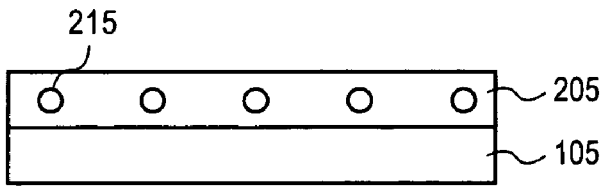
Figure 3D:
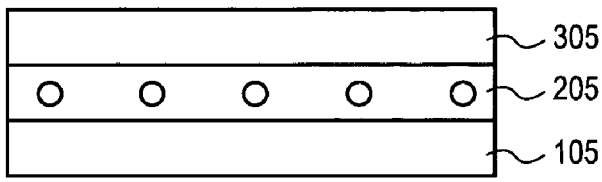
Figure 3E:
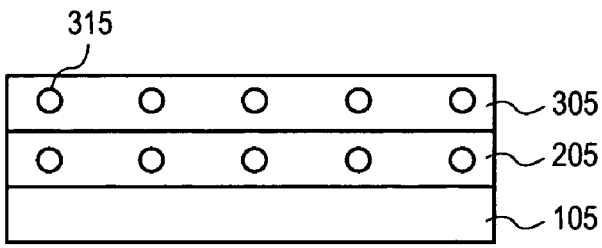
Figure 3F:
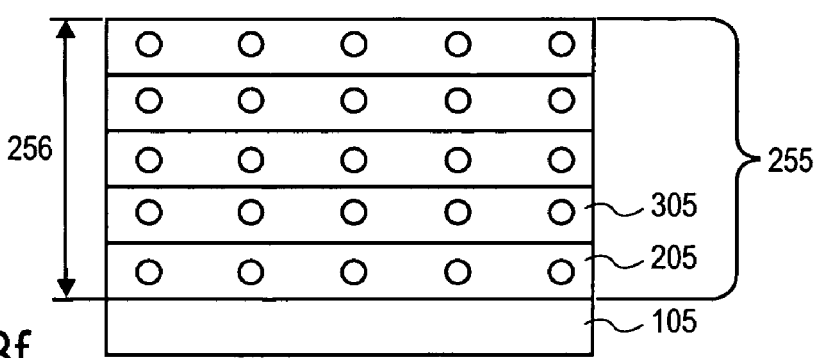

The thin film has pores. An embodiment of the thin film 220 with pores is shown in FIG. 2. The pores may have different shapes and locations. The types of pores in the thin film 220 include an upper surface pore 222, an embedded pore 224, a lower surface pore 226, and a through pore 228. The upper surface pore 222 and the through pore 228 are undesirable since they may be partially or entirely filled in by the overlying thin film 230. Furthermore, the region 232 over the upper surface pore 222 and the region 238 over the through pore 228 may become uneven in the overlying thin film 230. The lower surface pore 226 will not cause unevenness in the overlying thin film 230, but it may degrade adhesion to the underlying thin film 210. Consequently, the embedded pore 224 is the most desirable.

The embedded pore 224 will predominate if the pore concentration, or porosity, is maintained below about 30.0 volume %. In general, dielectric constant is a linear function of porosity. Thus, the porosity will determine the effective dielectric constant of the thin film 220 and the multilayer stack. For example, pores that are filled with air (dielectric constant=1.0) will lower the effective dielectric constant of the thin film 220. In one embodiment, the effective dielectric constant of the thin film 220 will be below about 2.4. In another embodiment, the effective dielectric constant of the thin film 220 will be below about 1.8.

The pores may have different sizes. Large pores will cause an unacceptable level of Line Edge Roughness (LER) in the features in the devices. Large pores may also create discontinuity in the barrier layer in the trench and via sidewalls in a Damascene process. As a result, it is better to have a smaller pore size for the same porosity. A typical pore size may be on the order of about 0.3–3.0 nm.

If there are too many pores or if the pores are too large, the mechanical strength of the thin film 220 and the multilayer stack may be degraded. Upper surface pores and lower surface pores, whenever present, should not stack up over each other for more than 3 consecutive thin films. It is necessary for the modulus of elasticity of the multilayer stack to be high enough to tolerate chemical-mechanical polishing (CMP) in a Damascene process. The fracture toughness, or the ability to resist fracture propagation, of the multilayer stack must also be high enough to withstand the stresses of CMP.

The choice of appropriate porosity, pore size, and pore shape in the thin film 220 will result in a multilayer stack with high dielectric breakdown voltage, low leakage current, high thermal conductivity, low coefficient of thermal expansion (CTE), low film stress, low moisture absorption, good adhesion, and good thermal stability. For example, the multilayer stack should remain stable up to about 425.0 degrees Centigrade. The thermal conductivity of the pores should also be taken into account to avoid reliability problems due to Joule heating in the metal levels of the multilevel interconnect system.

An embodiment of a process to form a low-dielectric constant structure including a multilayer stack of thin films with pores is shown in FIGS. 3(a)–(f). According to one embodiment of the present invention, a Chemical Vapor Deposition (CVD) process may be used to deposit a first thin film 205 over a substrate 105 using the appropriate reactants. The substrate 105 may include one or more materials, such as Silicon, Silicide, dielectric, or metal, disposed over a wafer. The reactants may include a porogen or a precursor having 10.0–25.0 weight % organic components, $C_xH_y$. A precursor to form a first thin film 205 out of silica may include an organosilicate compound, such as tetraethylorthosilicate (TEOS), or an organosilane compound, such as trimethylsilane or tetramethylsilane.

The deposition temperature for a CVD process may be about 200–400 degrees Centigrade. The Radio Frequency (RF) power may be about 1000–2000 Watts. The pressure may be about 450–620 Pascals. The flowrate of reactant may be about 50–500 Standard Cubic Centimeter per Minute (SCCM). An inert carrier gas, such as Helium or Argon, may be used. In another embodiment, a Plasma-Enhanced CVD (PECVD) process may be selected.

After deposition to the appropriate thickness, the first thin film 205 is treated to release a first set of organic components or porogens, leaving predominantly embedded pores 215 in the first thin film 205. The treatment may involve an anneal in which the first thin film 205 is heated. The treatment must not result in any cracking or blistering of the first thin film 205. In one embodiment, the temperature ramp is about 2.0 degrees Centigrade per minute.

The first thin film 205 must be thin enough to ensure that all of the organic components or porogens are released. The organic components or porogens are volatile and must be captured uniformly within the first thin film 205. The first thin film 205 must also be thin enough to avoid connecting pores 215. It is desirable for the pores 215 to be isolated from each other. In another embodiment, the treatment may involve exposure of the first thin film 205 to a plasma or a gas or a liquid.

The type and amount of organic components or porogens in the first thin film 205 help to determine the distribution of sizes and the variation in shapes of the pores 215. It is desirable to control the size and shape of the pores 215 because subsequent etch or Chemical-Mechanical Polishing (CMP), such as in a Damascene process, may reopen the pores 215 during fabrication of the multilevel interconnect system.

Next, a CVD process or a PECVD process may be used to deposit a second thin film 305 over the first thin film 205 using reactants, including a porogen or a precursor having 10.0–25.0 weight % organic components $C_xH_y$, such as an organosilicate compound or an organosilane compound. In one embodiment, the second thin film 305 is formed from the same reactants as the first thin film 205. In another embodiment, different porogens or organic components may be used to form different thin films.

The pores 215 in the first thin film 205 may include an upper surface pore, an embedded pore, a lower surface pore, and a through pore. The upper surface pore and the through pore in the first thin film 205 may be partially or entirely filled in by the second thin film 305. The region over the upper surface pore and the region over the through pore will become uneven if the deposition is conformal. The embedded pore and the lower surface pore in the first thin film 205 will remain intact. However, the lower surface pore may affect adhesion to the underlying substrate 105 so the embedded pore is the most desirable.

After deposition to the appropriate thickness, the second thin film 305 is treated to release a second set of organic components or porogens, leaving predominantly embedded pores 315 in the second thin film 305. The treatment may involve an anneal in which the second thin film 305 is heated. The treatment must not result in any cracking or blistering of the second thin film 305. In one embodiment, the temperature ramp is about 2.0 degrees Centigrade per minute.

The second thin film 305 must be thin enough to ensure that all of the organic components or porogens are released. The organic components or porogens are volatile and must be captured uniformly within the second thin film 305. The second thin film 305 must be thin enough to avoid connecting pores 315 with each other or with other pores 215 in the underlying first thin film 205. It is desirable for the pores 315 to be isolated from each other. In another embodiment, the treatment may involve exposure of the second thin film 305 to a plasma or a gas or a liquid.

The type and amount of organic components or porogens in the second thin film 305 help to determine the distribution of sizes and the variation in shapes of the pores 315. It is desirable to control the size and shape of the pores 315 because subsequent etch or CMP, such as in a Damascene process, may reopen the pores 315 during fabrication of the multilevel interconnect system.

The pores 315 in the second thin film 305 may include an upper surface pore, an embedded pore, a lower surface pore, and a through pore. The region over the upper surface pore and the region over the through pore will become uneven if the deposition is conformal. The embedded pore and the lower surface pore in the second thin film 305 will remain intact. However, the lower surface pore may affect adhesion to the underlying first thin film 205 so the embedded pore is the most desirable.

Subsequently, the deposition and the treatment are alternated and repeated as many times as needed to obtain a multilayer stack 255 with the desired total multilayer stack thickness 256. Upper surface pores and lower surface pores, whenever present, should not stack up over each other for more than 3 consecutive thin films. The deposition step and the treatment step may be performed in separate tools, or in separate chambers of one tool, or, in situ, in different process steps in one tool.

In one embodiment, each thin film within the multilayer stack 255 has the same thickness. In another embodiment, the odd number thin films are thinner than the even number thin films. With the deposition of each overlying thin film, any unevenness may replicate up through the multilayer stack 255. It is desirable to maintain a variation in topography of less than about 10.0 nm.

Many alternative embodiments and numerous particular details have been set forth above in order to provide a thorough understanding of the present invention. One skilled in the art will appreciate that many of the features in one embodiment are equally applicable to other embodiments. One skilled in the art will also appreciate the ability to make various equivalent substitutions for those specific materials, processes, dimensions, concentrations, etc. described herein. It is to be understood that the detailed description of the present invention should be taken as illustrative and not limiting, wherein the scope of the present invention should be determined by the claims that follow.

Thus, we have described a low-dielectric constant structure with a multilayer stack of thin films with pores and a method of forming such a structure.

I claim:

1. A device comprising a multilayer stack of thin films, said thin films comprising a low-dielectric constant material, said thin films having pores, wherein each thin film within said multilayer stack has a thickness of less than about 14.0 nm, wherein different porogens or organic components may be used to form different thin films.

2. The structure of claim 1 wherein said low-dielectric constant material comprises an inorganic oxide.

3. The structure of claim 2 wherein said inorganic oxide comprises Silicon Dioxide or silica.

4. The structure of claim 1 wherein said thin films have a porosity of below about 30.0 volume %.

5. The structure of claim 1 wherein said pores are embedded within said thin films.

6. The structure of claim 1 wherein said pores are unconnected.

7. The structure of claim 1 wherein said pores have a size on the order of 0.3–3.0 nanometers.

8. A multilevel interconnect system for a device comprising:
   an underlying metal level;
   a multilayer stack disposed over said underlying metal level, said multilayer stack comprising:
   thin films, said thin films having a low dielectric constant, said thin films having pores wherein each thin film within said multilayer stack has a thickness of less than about 14.0 nm, wherein said thin films are formed with a chemical vapor deposition process with reactants that include a porogen or precursor having 10.0–25.0 weight % organic components; and
   an overlying metal level disposed over said multilayer stack.

9. The multilevel interconnect system of claim 8 wherein said thin films have a porosity of below about 30.0 volume %.

10. The multilevel interconnect system of claim 8 wherein said pores are embedded within said thin films.

11. The multilevel interconnect system of claim 8 wherein said pores are unconnected.

12. The multilevel interconnect system of claim 8 wherein said pores have a size on the order of 0.3–3.0 nanometers.

* * * * *